US009551464B2

(12) United States Patent
Yang et al.

(10) Patent No.: US 9,551,464 B2
(45) Date of Patent: Jan. 24, 2017

(54) LOW PROFILE LED LAMP BULB

(71) Applicant: UniLED LIGHTING TW., INC., New Taipei (TW)

(72) Inventors: Po-Cheng Yang, Taipei (TW); Ming-Te Lin, New Taipei (TW); Ming-Yao Lin, New Taipei (TW)

(73) Assignee: UNILED LIGHTING TAIWAN INC., New Taipei (TW)

( * ) Notice: Subject to any disclaimer, the term of this patent is extended or adjusted under 35 U.S.C. 154(b) by 14 days.

(21) Appl. No.: 14/665,535

(22) Filed: Mar. 23, 2015

(65) Prior Publication Data

US 2016/0281936 A1 Sep. 29, 2016

(51) Int. Cl.

*H01L 33/00* (2010.01)
*F21K 99/00* (2016.01)
*F21V 29/503* (2015.01)
*F21V 29/76* (2015.01)
*F21Y 101/02* (2006.01)

(52) U.S. Cl.

CPC ........... *F21K 9/1355* (2013.01); *F21V 29/503* (2015.01); *F21V 29/76* (2015.01); *F21Y 2101/02* (2013.01)

(58) Field of Classification Search

CPC ................... H01L 33/62; H01L 33/644; H01L 2924/0002; H01L 33/64; H01L 33/647; F21V 29/22; F21V 29/70; F21V 3/00; F21V 5/007; F21V 29/503; F21V 29/508; F21V 29/71; F21V 29/713; F21V 29/76; F21V 29/777; F21K 9/135

See application file for complete search history.

(56) References Cited

U.S. PATENT DOCUMENTS

| | | | | |
|---|---|---|---|---|
| 8,791,484 | B2 | 7/2014 | Lin et al. | |
| 9,041,040 | B2 * | 5/2015 | Lin | F21K 9/135 257/98 |
| 9,285,082 | B2 * | 3/2016 | Athalye | F21V 29/70 |
| 2010/0207502 | A1 * | 8/2010 | Cao | F21V 3/00 313/46 |
| 2013/0240920 | A1 * | 9/2013 | Lin | F21K 9/135 257/89 |
| 2013/0250585 | A1 * | 9/2013 | Le Toquin | H01L 33/08 362/373 |
| 2013/0271981 | A1 * | 10/2013 | Hussell | F21V 7/00 362/235 |
| 2014/0268771 | A1 * | 9/2014 | Heikman | F21K 9/135 362/249.02 |
| 2014/0268772 | A1 * | 9/2014 | Richards | F21K 9/232 362/249.02 |
| 2014/0321126 | A1 * | 10/2014 | Narag | H05K 1/189 362/306 |
| 2015/0241049 | A1 * | 8/2015 | Pickard | F21K 9/135 362/294 |
| 2015/0300619 | A1 * | 10/2015 | Reier | F21V 29/503 362/249.02 |
| 2016/0069518 | A1 * | 3/2016 | Steele | F21V 7/00 362/84 |
| 2016/0238230 | A1 * | 8/2016 | Trottier | F21V 29/763 |

* cited by examiner

*Primary Examiner* — Anabel Ton

(74) *Attorney, Agent, or Firm* — Hauptman Ham, LLP

(57) ABSTRACT

A low profile LED lamp with high efficient heat dissipation is disclosed. Each of the lead frame unit has a left top metal section, left middle metal section, right top metal section, and a top-down tapered metal section. The top-down tapered metal section is bent inwards to form a lead frame bottom cup which is suitable for fitting in the low profile LED lamp.

11 Claims, 9 Drawing Sheets

LOW PROFILE LED LAMP BULB

BACKGROUND

Technical Field

The present invention relates to an LED lamp, especially related to a low profile LED lamp.

Description of Related Art

FIGS. 1A~1B show a prior art.

FIG. 1A shows a prior art lead frame

FIG. 1A shows that U.S. Pat. No. 8,791,484 disclosed an LED lamp which has a lead frame including a top metal 22, 22P, a metal lead 21, a branch lead 23 paralleled with the metal lead 21. A metal connection 27 connecting the metal lead 21 and the branch lead 23. An LED chip 26 straddles the gap G between the top metal pad 22P and the metal lead 21.

Since the metal lead 21 is in a shape of a longitudinal elongated rectangle and the metal connection 27 is configured near the bottom of the metal lead 21. The bottom part of the metal lead 21 is not suitable for bending inwards to make a low profile LED lamp. Bending the bottom metal plate 21 inwards shall cause circuit short and damage the LED lamp.

FIG. 1B shows an LED lamp using the traditional lead frame of FIG. 1A

FIG. 1B shows a traditional LED lamp using the lead frame of FIG. 1A. Due to the long length in longitudinal direction of the metal lead 21, an exclusive heat sink 914 in cylinder shape is needed for the lower portion of the metal lead 21 to attach. A lamp base 66 is configured on bottom of the heat sink 914. Based on the metal lead 21 to be used in the prior art LED lamp, the height of the LED lamp is significantly greater than a traditional one. However, for some applications, a low profile LED lamp is required while with high heat dissipation.

The prior art long metal lead 21 can not meet the height requirement for producing a low profile LED lamp in some applications. Further, an exclusive heat sink 914 has to be configured for the lower portion of the metal lead 21 to attach. The prior art LED lamp is bulky and heavy. The disadvantage for the prior art LED lamp includes height problem and weight problem. A low profile LED lamp without having an exclusive heat sink while with high heat dissipation is eagerly required.

DETAILED DESCRIPTION OF THE INVENTION

The present invention discloses a low profile LED lamp with light weight and high heat dissipation is eagerly required. The present invention LED lamp is light weight because it does not need to have an exclusive heat sink for heat dissipation.

Figures 1A, 1B:
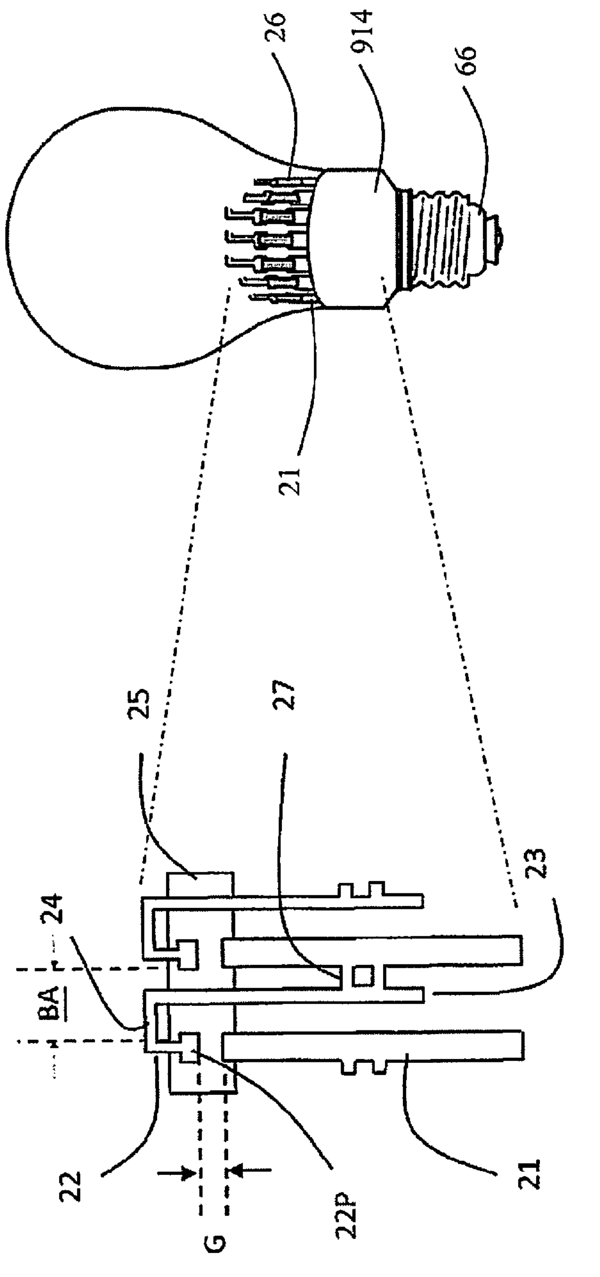
Fig.1B Prior Art
Fig.1A Prior Art
FIGS. 1A~1B show a prior art.
Figures 2A, 2B:
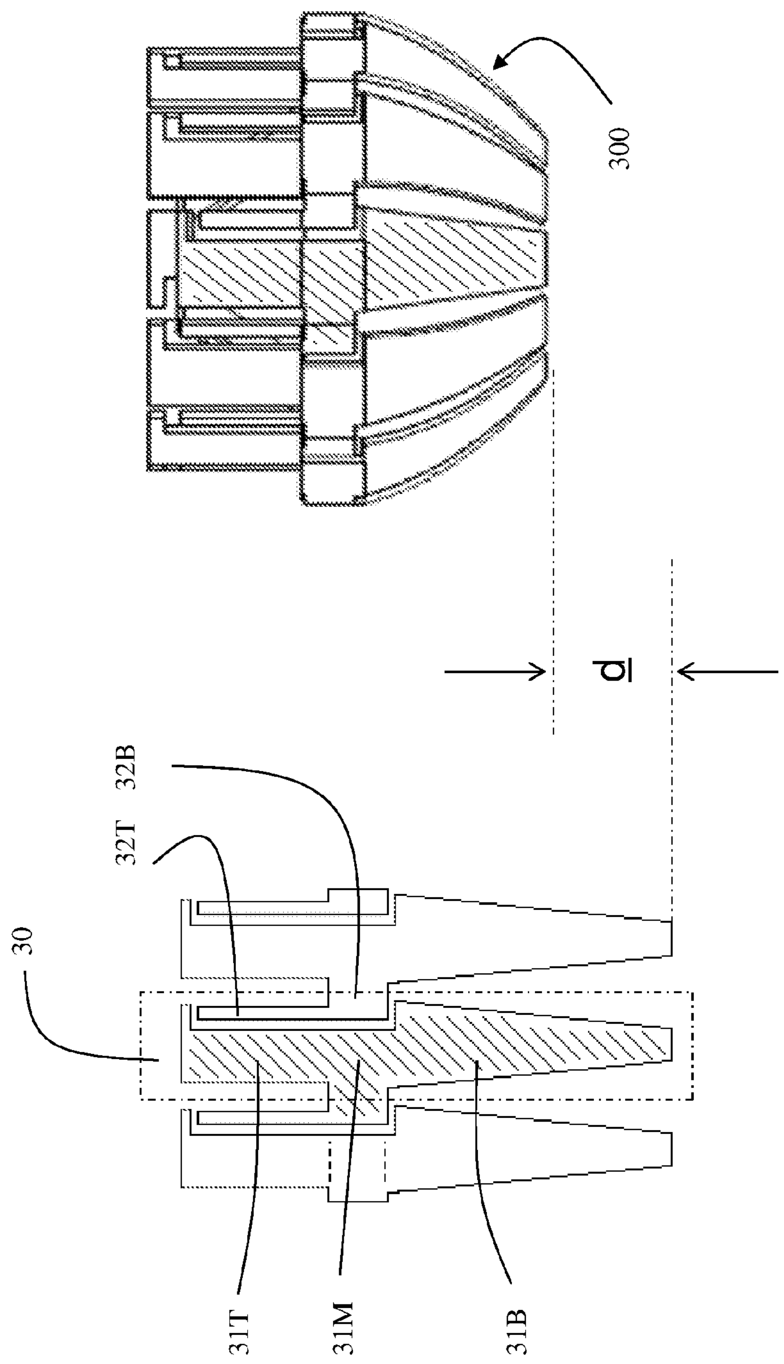
FIGS. 2A~2B show a lead frame according to the present invention.

FIGS. 2A~2B show a lead frame according to the present invention

FIG. 2A shows a lead frame suitable for being configured in a low profile LED lamp. The lead frame has a plurality of lead frame units 30, each lead frame unit 30 further comprises a left top metal section 31T, a left middle metal section 31M connected with a bottom end of the left top section 31T. A right top metal section 32T is configured independent from the left top metal section 31T, and a right bottom metal section 32B is connected with a bottom end of the right top section 32T, and a top-down tapered metal section 31B is connected with a bottom end of the left middle metal section 31M. The top-down tapered metal section 31B is configured on bottom of the right bottom metal section 32B and electrically isolated from the right bottom metal section 32B; the top-down tapered metal section 31B is adaptive for bending inwards to form a cup bottom which is suitable for fitting in the low profile LED lamp. FIG. 2A shows the right bottom metal section 32B of a lead frame unit 30 is integrated with a left middle metal section 31M of another lead frame unit 30 in its right side.

FIG. 2B shows the lower portion of the lead frame bended inwards to form a lead frame bottom cup 300 on bottom. The difference height d is shown between a bottom of the FIG. 2A and a bottom of FIG. 2B. The height d is reduced from the total height of the lead frame unit 30 after the lead frame has been bent inwards to form a lead frame metal cup 300. So that a low profile LED lamp is developed with the lead frame metal cup 300 of FIG. 2B according to the present invention.

Figures 3A, 3B:
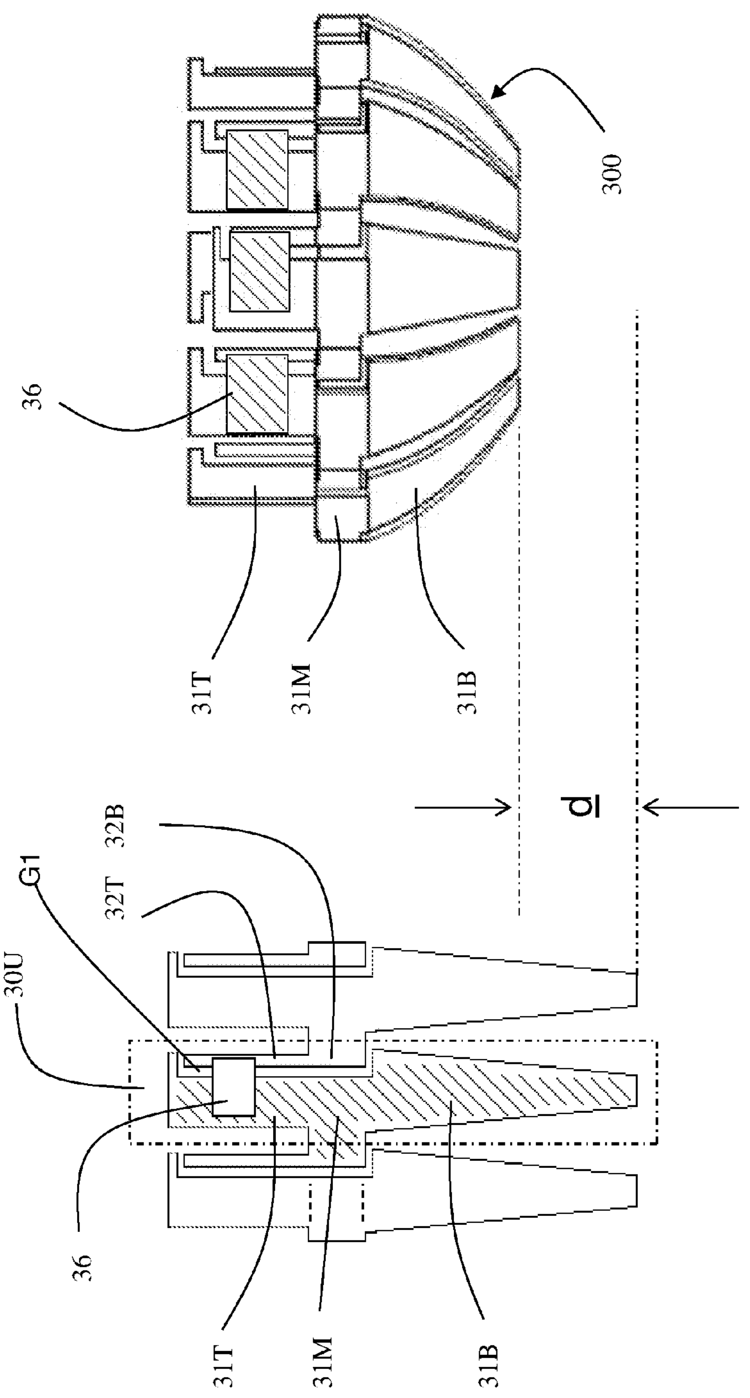
FIGS. 3A~3B show a light unit for a low profile LED lamp according to the present invention.

FIGS. 3A~3B show a light unit for a low profile LED lamp according to the present invention FIG. 3A shows an LED chip 36 straddling a gap G1 between the left top metal section 31T and the right top metal section 32T to form a light unit 30U.

FIG. 3B shows light unit for a low profile LED lamp according to the present invention FIG. 3B shows a low profile light units suitable for a low profile LED lamp can be made after bending the bottom portion of the lead frame of FIG. 3A. FIG. 3B shows a bottom cup 300 is formed which is suitable for being configured inside a low profile LED lamp. The LED chip 36 in combination with the left top metal section 31T and the right top metal section 32T are integrated into a group which is bendable so that it is possible to adjust the light direction of the LED chip 36 before assembly.

Figure 4B:
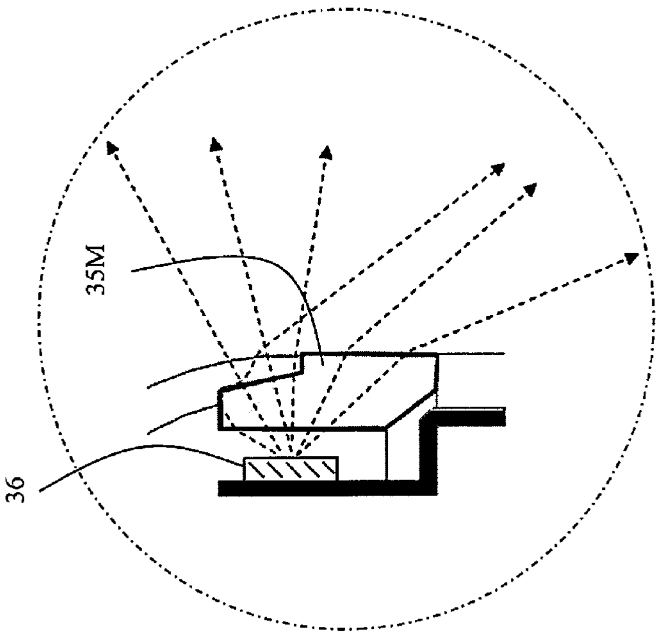
FIGS. 4A~4B show a low profile LED lamp according to the present invention.
Figure 4A:
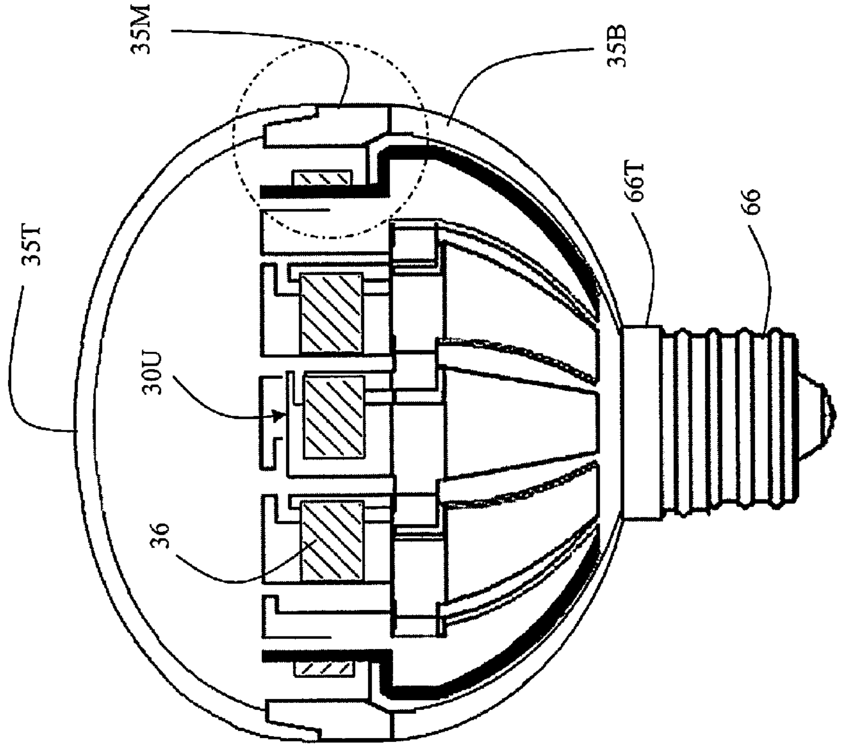

FIGS. 4A~4B show a low profile LED lamp according to the present invention FIG. 4A shows a low profile LED lamp can be made by using the low profile lead frame bottom cup 300. A protection cover 35 comprises a top cover 35T, a circular lens 35M, and a protection bottom cup 35B. The top cover 35T is configured on top of the plurality of light units 30U. The circular lens 35M is configured on a bottom end of the top cover 35T. The protection bottom cup 35B is configured on a bottom end of the circular lens 35M. The lead frame bottom cup 300 fits in the inner side of the protection bottom cup 35B.

The top-down tapered bottom metal section 31B attaches onto an inner surface of the protection bottom cup 35B. Heat generated from the light unit 30U can be dissipated through the protection bottom cup 35B which is configured to contact the top-down tapered bottom metal section 31B. The combination of the top cover 35T, the circular lens 35M, and the protection bottom cup 35B forms a bulb to protect the LED lamp from being contaminated by dust and moisture. A lamp base 66 is configured on a bottom end of the protection bottom cup 35B. A top metal ring 66T is configured on a top of the lamp base 66 for a better connection between the protection bottom cup 35B and the lamp base 66.

FIG. 4B shows that the circular lens 35M is aligned with the plurality of LED chips so that the direction of light beam emitted from the LED chip 36 can be projected into a wide range illumination including a bottom section of the LED lamp as shown in FIG. 4B.

FIG. 4B shows the circular lens 35M is configured at a waist of the protection cover 35; the plurality of light chips 36 facing the circular lens 35M. The circular lens 35M modifies the light beam emitted from the light chips 36. FIG. 4B shows that the light beams fans out after passing the circular lens 35M as an example.

Figure 5A:
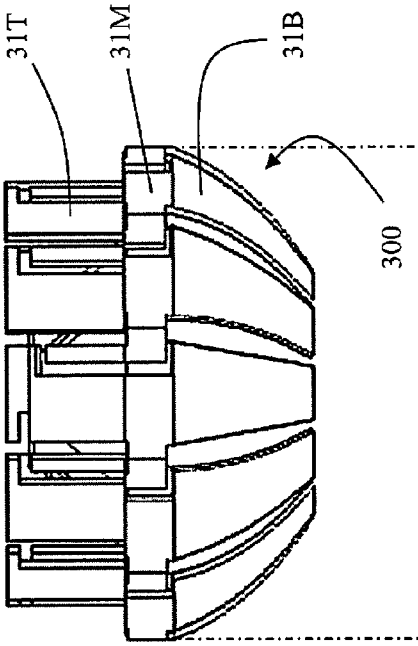
FIGS. 5A~5B show different views over the low profile lead frame according to the present invention.
Figure 5B:
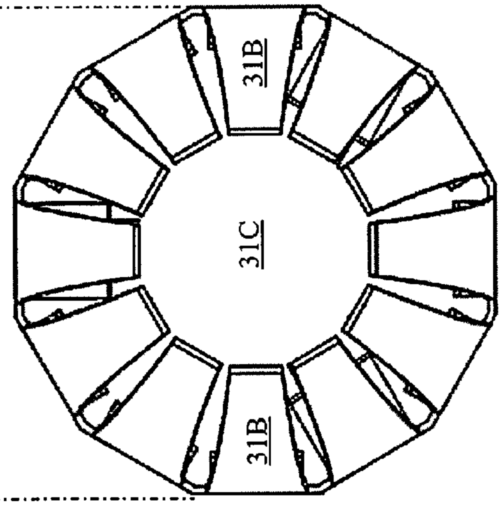

FIGS. 5A~5B show different views over the low profile lead frame according to the present invention FIG. 5A shows a side view of the low profile lead frame according to the present invention. The low profile lead frame is formed mainly because of the bendable top-down tapered metal section 31B which is bendable inwards to form a lead frame metal cup 300.

FIG. 5B shows a bottom view of the low profile lead frame of FIG. 5A

FIG. 5B show a circular area 31C is formed in the center communicated with a space of the lamp base 66.

Figure 6B:
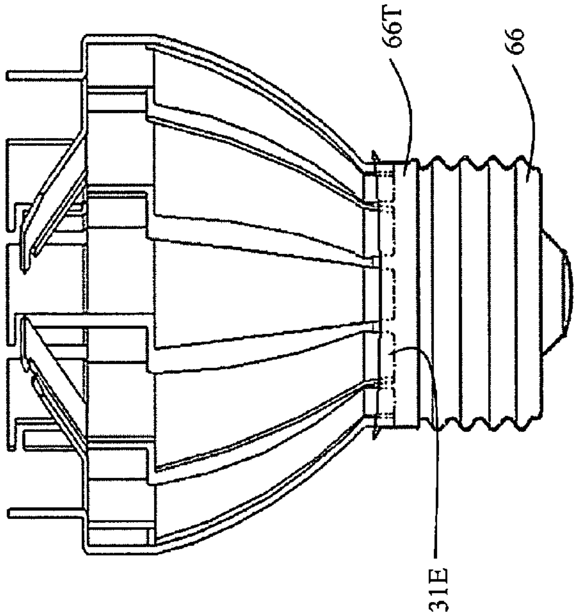
FIGS. 6A~6B show a modification embodiment according to the present invention.
Figure 6A:
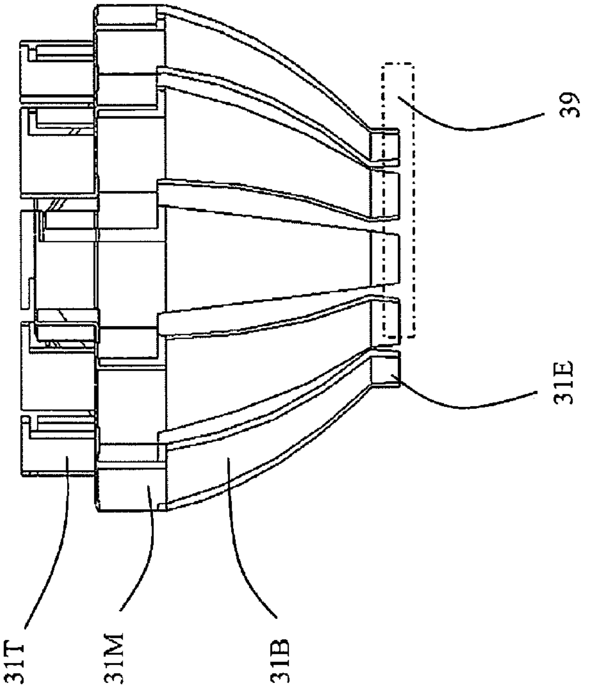

FIGS. 6A~6B show a modification embodiment according to the present invention FIG. 6A shows metal extension 31E is extended from a bottom end of the top-down tapered metal section 31B. The metal extension 31E is then attached onto an inner surface of the top metal ring 66T so that partial of the heat generated from the light unit 30U can be dissipated from the lamp base 66. An insulation layer 39 is sandwiched between the metal extension 31E and the top metal ring 66T for electrical insulation there between.

FIG. 6B shows the metal extension 31E attached onto an inner surface of the top metal ring 66T so that partial heat generated from the light unit 30U can be dissipated from the lamp base 66.

Figures 7A, 7B, 7C:
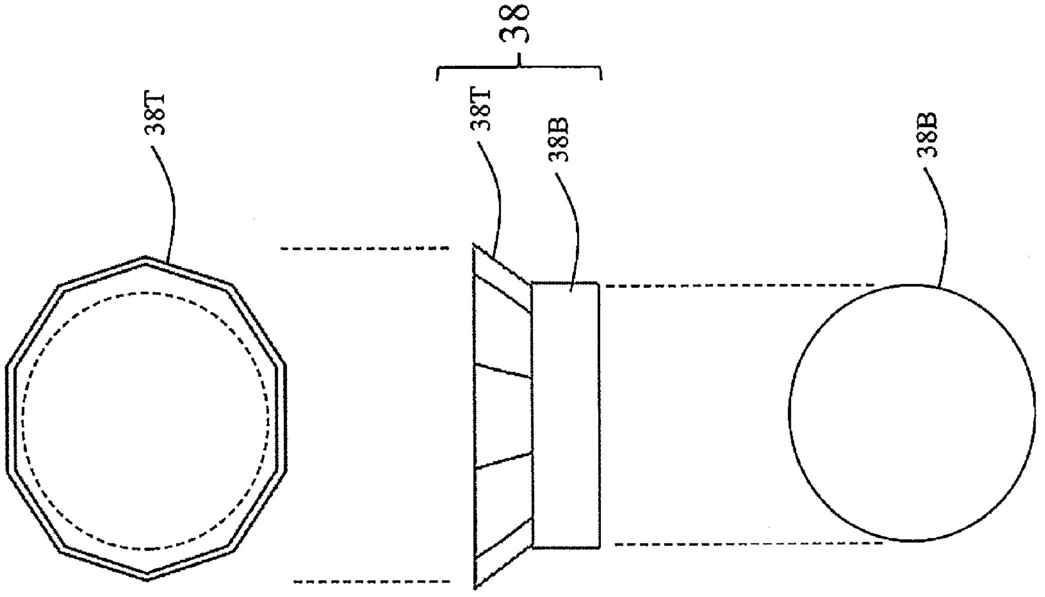
FIGS. 7A~7C show a metal interposer heat coupler according to the present invention.

FIGS. 7A~7C show a metal interposer heat coupler according to the present invention FIG. 7A shows a metal interposer 38 functions as a heat coupler between the lead frame metal cup 300 and the lamp base 66 so that partial of the heat generated from the light unit 30U can be transmitted to the lamp base 66 for a better heat dissipation.

FIG. 7B shows the metal interposer 38 comprises a polygon metal 38T configured on top. Each facet of the polygon metal 38T matches one of the top-down tapered metal sections 31B of the lead frame bottom cup 300.

FIG. 7C shows the metal interposer 38 comprises a cylinder metal 38B configured on bottom.

Figure 8:
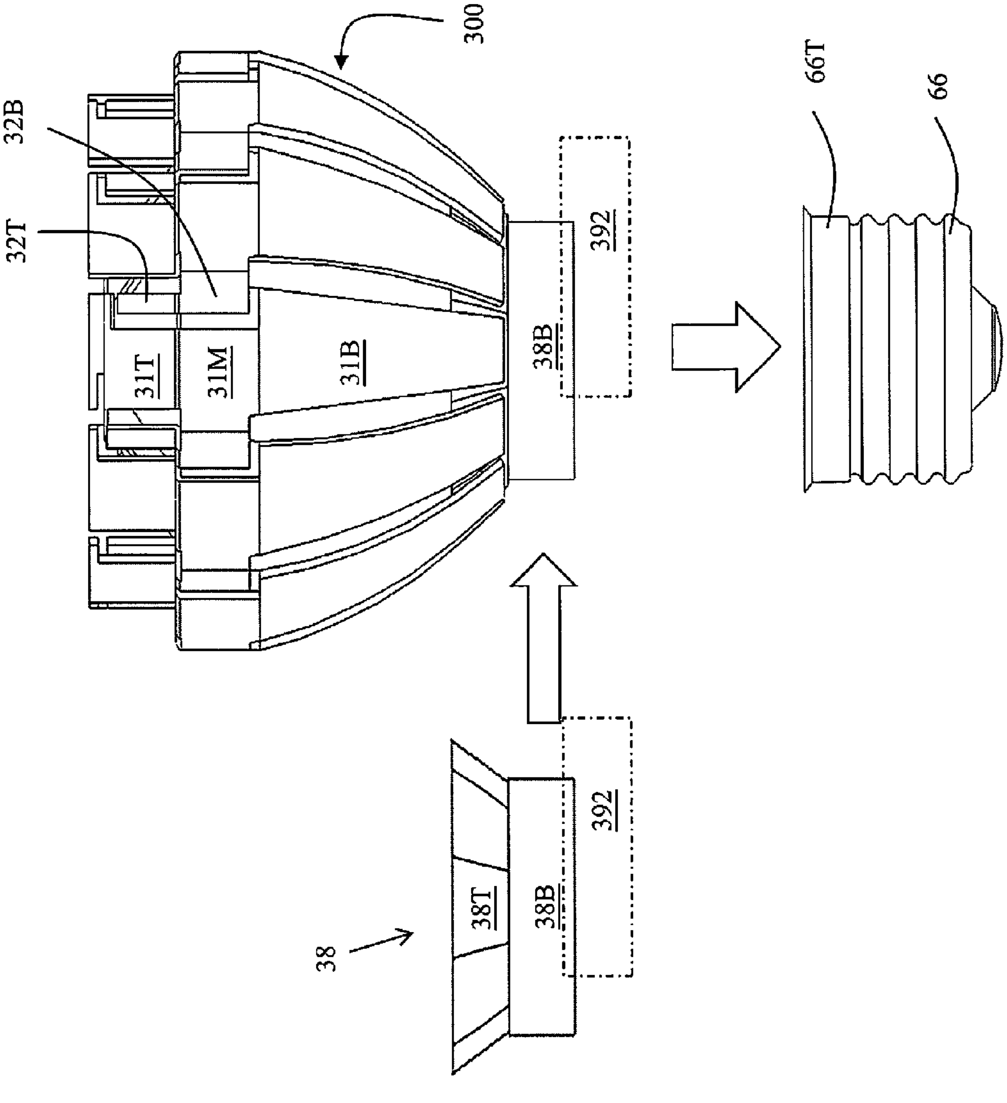
FIG. 8 shows another modification embodiment according to the present invention.

FIG. 8 shows another modification embodiment according to the present invention FIG. 8 show the metal interposer 38 is inserted in the center of the lead frame, wherein the polygon top 38T touches inner surface of the top-down tapered metal section 31B; and the bottom of the cylinder metal 38B fits in the central space of the top metal ring 66T of the lamp base 66. An insulation layer 392 is inserted between the cylinder metal 38B and the top metal ring 66T for electrically insulation there between.

Figure 9:
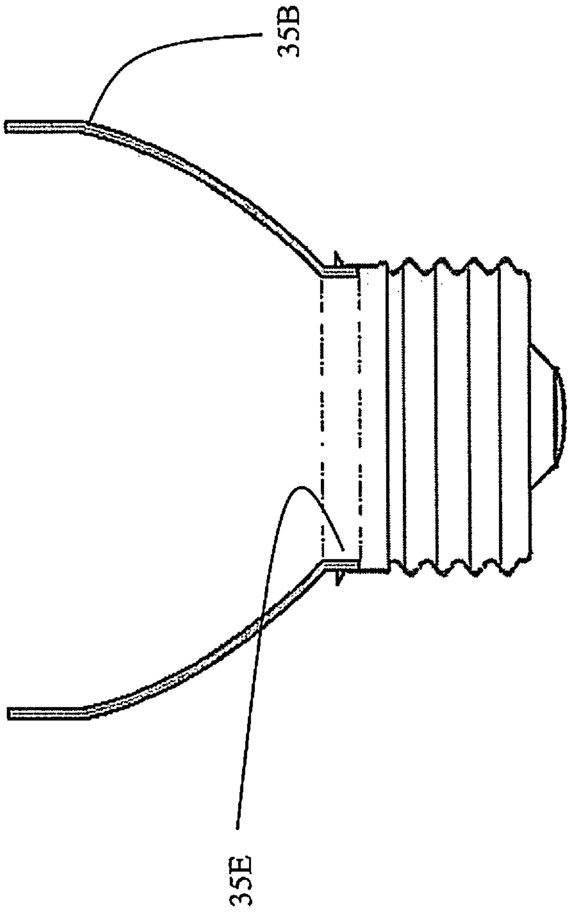
FIG. 9 shows a bottom cup according to the present invention.

FIG. 9 shows a bottom cup according to the present invention.

FIG. 9 show the bottom cup 35B has a bottom extension 35E protruded downwards from the bottom. The bottom extension 35E function as the insulation layer 39, 392.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A light emitting diode (LED) lamp bulb, comprising:

a lead frame comprising a plurality of lead frame units, each lead frame unit among the plurality of lead frame units comprising:

a left top metal section;

a left middle metal section connected with a bottom end of the left top metal section in a height direction of the lead frame unit;

a right top metal section physically and electrically separated from the left top metal section by a gap in a width direction of the lead frame unit;

a right bottom metal section connected with a bottom end of the right top metal section in the height direction of the lead frame unit; and a top-down tapered metal section connected with a bottom end of the left middle metal section in the height direction of the lead frame unit, wherein the top-down tapered metal section has a portion arranged below the right bottom metal section in the height direction of the lead frame unit, and said portion is electrically isolated from the right bottom metal section, said top-down tapered metal section has a width tapered away from the left middle metal section in the height direction of the lead frame unit, and said top-down tapered metal section is bent inwards and towards the top-down tapered metal sections of other lead frame units among the plurality of lead frame units to form a lead frame bottom cup.

2. The LED lamp bulb as claimed in claim 1, wherein the right bottom metal section of each lead frame unit among the plurality of lead frame units has a right side integrated with a left side of the left middle metal section of another lead frame unit among the plurality of lead frame units.

3. The LED lamp bulb as claimed in claim 1, further comprising a plurality of LED chips, wherein, for each lead frame unit among the plurality of lead frame units, an LED chip among the plurality of LED chips straddles the gap between the left top metal section and the right top metal section to form a light unit.

4. The LED lamp bulb as claimed in claim 3, wherein the LED chip, in combination with the left top metal section and the right top metal section, is bendable to adjust a light beam direction of the LED chip.

5. The LED lamp bulb as claimed in claim 3 further comprising:

a top cover on top of the lead frame and covering the plurality of LED chips from above;

a circular lens on a bottom end of the top cover, extending around and aligned with the plurality of LED chips; and a protection bottom cup on a bottom end of the circular lens and covering the plurality of LED chips from below;

wherein the lead frame bottom cup fits in the protection bottom cup, and wherein the top cover, the circular lens, and the protection bottom cup together form a bulb in which the plurality of LED chips are arranged.

6. The LED lamp bulb as claimed in claim 1, further comprising:

a metal extension extended from a bottom end of the top-down tapered metal section.

7. The LED lamp bulb as claimed in claim 6 further comprising:

a lamp base having a top metal ring at a top end of the lamp base, wherein the metal extension is attached onto an inner surface of the top metal ring; and an insulation layer sandwiched between the metal extension and the top metal ring.

8. The LED lamp bulb as claimed in claim 7, further comprising a metal interposer, the metal interposer comprising:

a polygon metal section; and a cylinder metal section connected with a bottom end of the polygon metal section; wherein the polygon metal section is connected to an inner surface of the top-down tapered metal section of each lead frame unit among the plurality of lead frame units; and a bottom end of the cylinder metal section is inserted into a center space of the lamp base.

9. The LED lamp bulb as claimed in claim 5, wherein the protection bottom cup further has a bottom extension protruded downwards from its bottom end.

10. The LED lamp bulb as claimed in claim 5, wherein the circular lens is configured to modify the light beams emitted from the plurality of LED chips.

11. The LED lamp bulb as claimed in claim 10, wherein the light beams fan out after passing through the circular lens.

* * * * *